(12) United States Patent
Yamaura

(10) Patent No.: US 10,555,418 B2
(45) Date of Patent: Feb. 4, 2020

(54) COMPONENT MODULE

(71) Applicant: Murata Manufacturing Co., Ltd., Kyoto (JP)

(72) Inventor: Masashi Yamaura, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 36 days.

(21) Appl. No.: 15/870,031

(22) Filed: Jan. 12, 2018

(65) Prior Publication Data
US 2018/0206340 A1 Jul. 19, 2018

Related U.S. Application Data

(60) Provisional application No. 62/445,973, filed on Jan. 13, 2017.

(51) Int. Cl.
H05K 1/00 (2006.01)
H05K 1/18 (2006.01)
H05K 1/02 (2006.01)
H05K 1/11 (2006.01)
H05K 1/14 (2006.01)

(52) U.S. Cl.
CPC .............. *H05K 1/183* (2013.01); *H05K 1/028* (2013.01); *H05K 1/115* (2013.01); *H05K 1/144* (2013.01); *H05K 2201/042* (2013.01); *H05K 2201/1003* (2013.01); *H05K 2201/10015* (2013.01); *H05K 2201/10022* (2013.01); *H05K 2201/10522* (2013.01)

(58) Field of Classification Search
CPC ......... H01L 2924/0002; H01L 2924/00; H01L 23/3128; H01L 23/3135; H01L 23/315; H01L 23/4985; H01L 2924/00014; H01L 2224/0401; H01L 2224/16225; H01L 2224/32145; H01L 2224/32225; H01L 2224/73203
See application file for complete search history.

(56) References Cited

U.S. PATENT DOCUMENTS 5,523,695 A * 6/1996 Lin ...................... G01R 1/0416
324/756.02
5,805,422 A * 9/1998 Otake ................... H01L 23/4985
257/737

(Continued)

FOREIGN PATENT DOCUMENTS

JP 2005-244211 A 9/2005

*Primary Examiner* — Yuriy Semenenko
(74) *Attorney, Agent, or Firm* — Pearne & Gordon LLP

(57) ABSTRACT

A component module includes a circuit board having a first base, a second base facing the first base, and a side section connected to the first and second bases. A wiring pattern is formed on at least one of a first facing surface of the first base that faces the second base, a second facing surface of the second base that faces the first base, and a side section facing surface of the side section that faces a direction in which the first and second bases extend. The component module further includes an electronic component that is in contact with at least one of the first facing surface, the second facing surface, and the side section facing surface. A sealing resin is formed in a region surrounded by the first facing surface, the second facing surface, and the side section facing surface so as to seal the electronic component.

19 Claims, 8 Drawing Sheets

(56) References Cited

U.S. PATENT DOCUMENTS

| | | | | |
|---|---|---|---|---|
| 5,973,395 A | * | 10/1999 | Suzuki | H01L 23/3128 |
| | | | | 257/692 |
| 6,444,921 B1 | * | 9/2002 | Wang | H01L 23/49827 |
| | | | | 174/254 |
| 6,646,335 B2 | * | 11/2003 | Emoto | H01L 23/3107 |
| | | | | 257/686 |
| 7,149,095 B2 | * | 12/2006 | Warner | H01L 23/5387 |
| | | | | 361/803 |
| 8,064,213 B2 | | 11/2011 | Asahi et al. | |
| 2002/0180022 A1 | * | 12/2002 | Emoto | H01L 23/3107 |
| | | | | 257/686 |
| 2003/0168725 A1 | * | 9/2003 | Warner | H01L 23/5387 |
| | | | | 257/686 |
| 2004/0115920 A1 | * | 6/2004 | Yamazaki | H01L 23/4985 |
| | | | | 438/613 |
| 2005/0167817 A1 | * | 8/2005 | Damberg | H01L 23/5385 |
| | | | | 257/698 |
| 2005/0168960 A1 | * | 8/2005 | Asahi | H01L 21/568 |
| | | | | 361/761 |
| 2008/0122054 A1 | * | 5/2008 | Szewerenko | H01L 23/3128 |
| | | | | 257/679 |
| 2017/0207173 A1 | * | 7/2017 | Hsu | H01L 23/5389 |

* cited by examiner

Fig. 11A
Prior Art
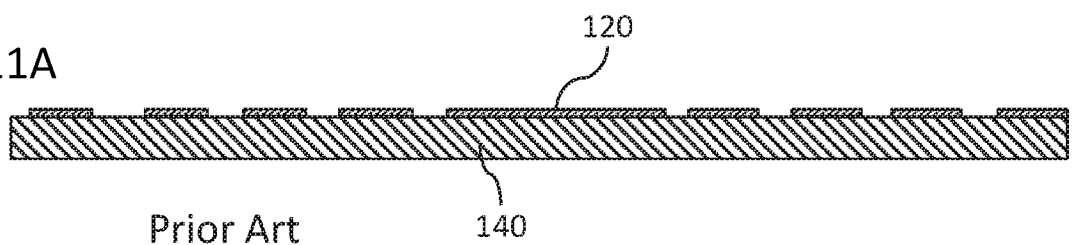
Fig. 11B
Prior Art
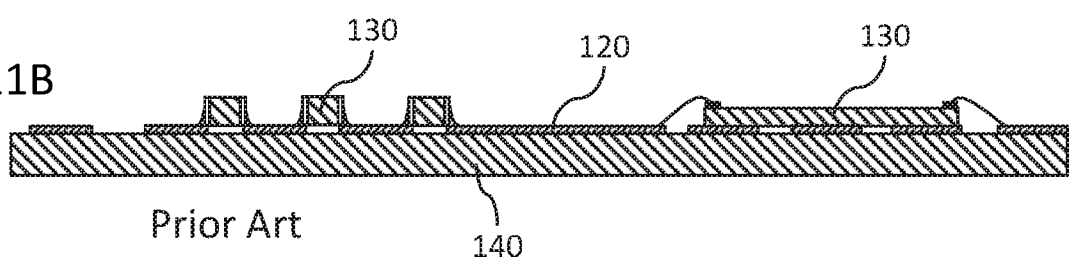
Fig. 11C
Prior Art
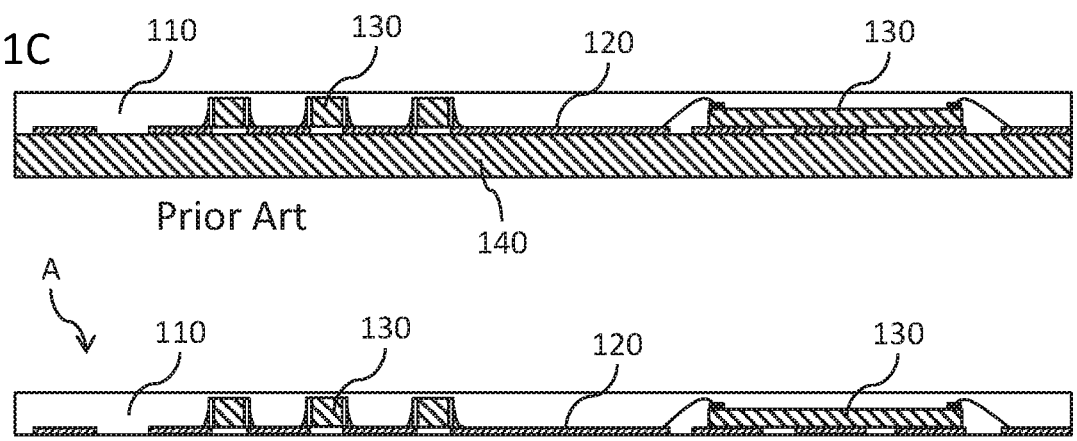
Fig. 11D  Prior Art
Fig. 11E
Prior Art
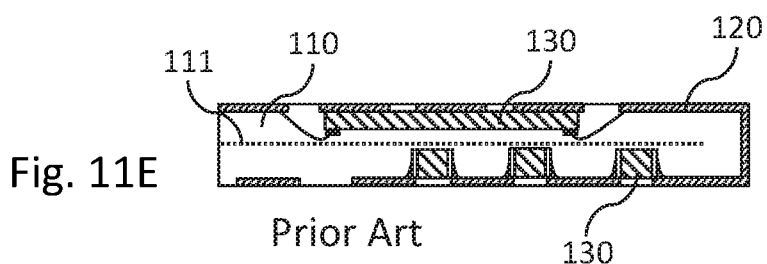

COMPONENT MODULE

This application claims the benefit of U.S. Provisional Application No. 62/445,973, filed Jan. 13, 2017, which is incorporated in its entirety herein by reference.

BACKGROUND

Field

The present disclosure relates to a component module.

Description of Related Art

Patent Document 1 (Japanese Patent Application Laid-Open No. 2005-244211) describes a component built-in module 100, which is illustrated in FIG. 10A and FIG. 10B. FIG. 10A is a schematic perspective view of the component built-in module 100, and FIG. 10B is a schematic sectional view of the component built-in module 100 taken on a line V-V' illustrated in FIG. 10A. The component built-in module 100 has an upper surface 110a, a lower surface 110b, an insulating sheet-like substrate 110 having side surfaces 110c that connect the upper surface 110a and the lower surface 110b, a wiring pattern 120 that extends from the upper surface 110a to the lower surface 110b through the side surfaces 110c, and electronic components 130 disposed in the insulating sheet-like substrate 110.

Referring to FIG. 11A to FIG. 11E, the manufacturing method of the component built-in module described in Patent Document 1 will be described. First, the predetermined wiring pattern 120 formed of a metallic foil is formed on a resinous carrier sheet 140 (FIG. 11A). Then, various types of electronic components 130 are mounted on the wiring pattern 120 (FIG. 11B). Next, a thermosetting resin, the hardening reaction of which has been interrupted in a medium stage (stage B), is applied on the carrier sheet 140 such that the wiring pattern 120 and the electronic components 130 are covered, thus forming the insulating sheet-like substrate 110 (FIG. 11C). Next, the carrier sheet 140 is removed, thereby providing a component built-in module forming member A (FIG. 11D). Next, the component built-in module forming member A is folded such that the thermosetting resins come in contact with each other on a surface denoted by a dotted line 111 (FIG. 11E). Then, the obtained structure is heated and pressurized to be completely hardened. This completes the component built-in module 100.

In the foregoing component built-in module 100, the inner side of the folded portion of the insulating sheet-like substrate 110 is filled with only a resin having relatively low strength. Therefore, if a large force is applied to the component built-in module 100, then the shape of the folded portion may be compromised. Further, according to the manufacturing method of the component built-in module 100, it is difficult to fold the component built-in module forming member A into a desired shape.

SUMMARY

An object of the present invention is to provide a component module in which a folded portion has a stabilized shape.

A component module in accordance with the present disclosure includes: a circuit board having a first base, a second base facing the first base, and a side section connected to the first base and the second base; a wiring pattern formed integrally with a first facing surface of the first base that faces the second base, a second facing surface of the second base that faces the first base, and a side section facing surface of the side section that faces a direction in which the first base and the second base extend; an electronic component that is in contact with at least one of the first facing surface, the second facing surface, and the side section facing surface; and a sealing section formed in a region surrounded by the first facing surface, the second facing surface, and the side section facing surface such that the sealing section seals the electronic component.

The present disclosure makes it possible to provide a component module in which a bent portion has a stabilized shape.

BRIEF DESCRIPTION OF DRAWINGS

FIG. 11A is a diagram illustrating a manufacturing method of the component built-in module 100;

FIG. 11B is another diagram illustrating the manufacturing method of the component built-in module 100;

FIG. 11C is yet another diagram illustrating the manufacturing method of the component built-in module 100;

FIG. 11D is still another diagram illustrating the manufacturing method of the component built-in module 100; and FIG. 11E is another diagram illustrating the manufacturing method of the component built-in module 100.

DETAILED DESCRIPTION

The following will describe various embodiments of the present invention with reference to the accompanying drawings. It should be noted, however, that the scope of the present disclosure is not limited to the embodiments and covers the features described in the appended claims and equivalents thereof.

First Embodiment

Figure 1A:
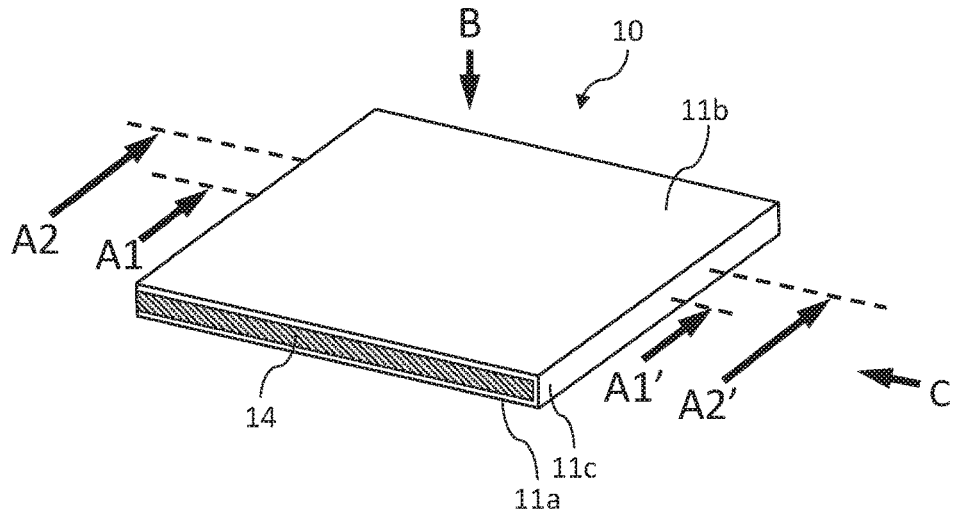
FIG. 1A is a schematic perspective view of a component module 10 according to a first embodiment of the present invention.
Figure 1B:
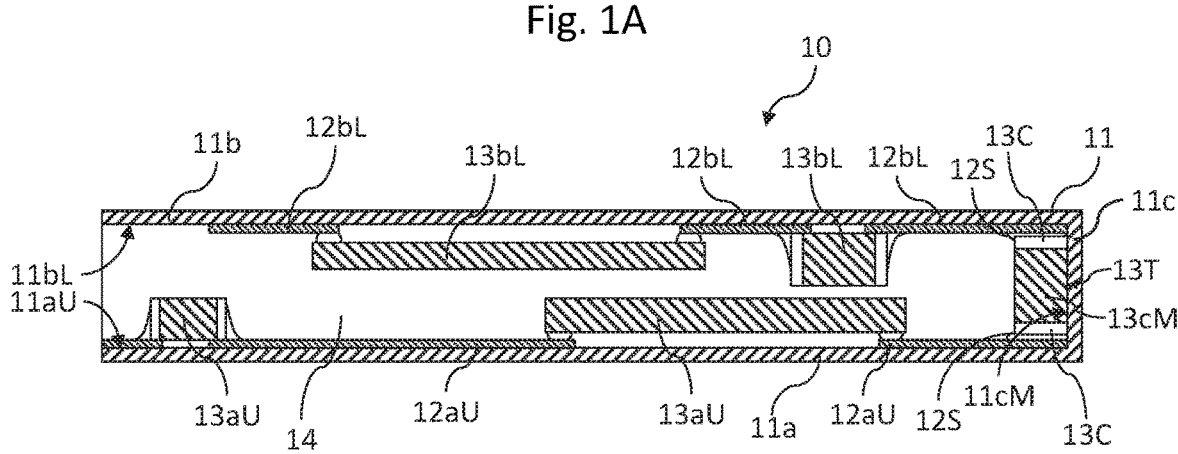
FIG. 1B is a schematic sectional view of the component module 10 taken on line A1-A1' illustrated in FIG. 1A.
Figure 1C:
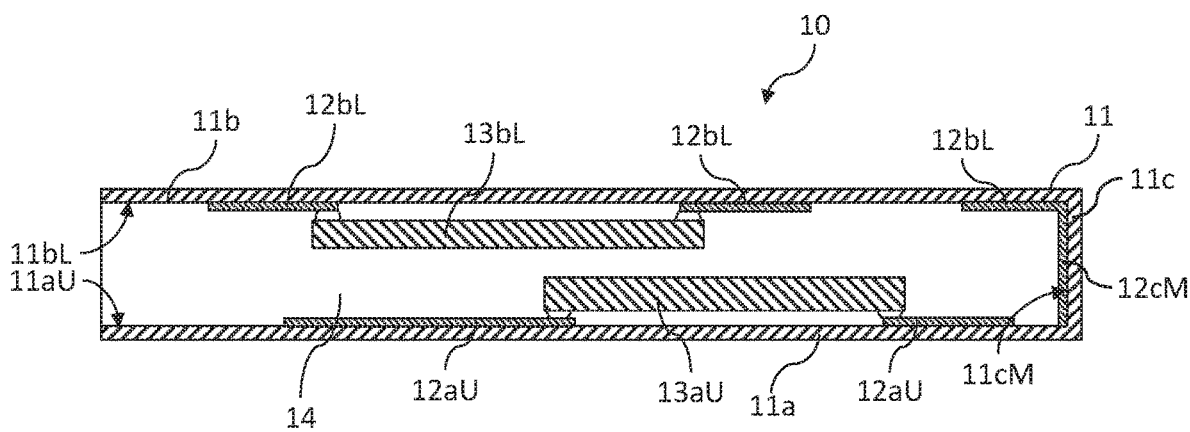
FIG. 1C is a schematic sectional view of the component module 10 taken on line A2-A2' illustrated in FIG. 1A.
Figure 2A:
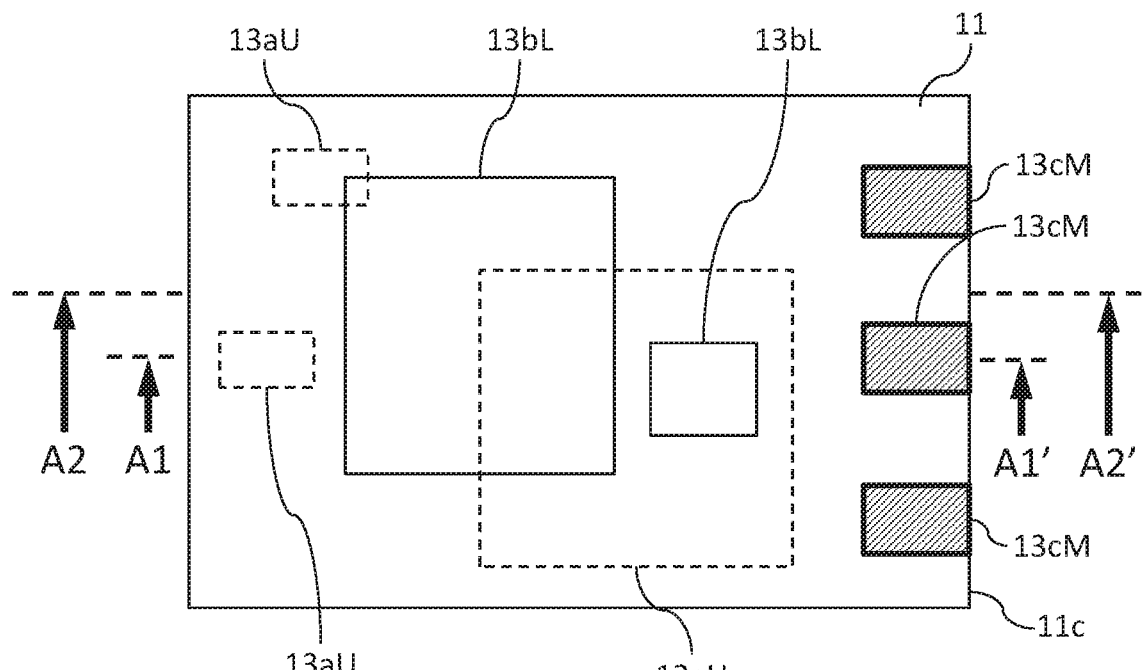
FIG. 2A is a schematic top view of the component module 10 observed from a direction B illustrated in FIG. 1A.
Figure 2B:
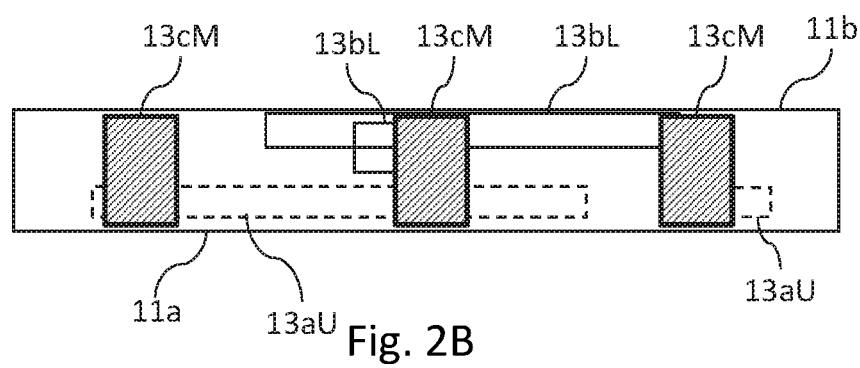
FIG. 2B is a schematic side view of the component module 10 observed from a direction C illustrated in FIG. 1A.

FIG. 1A is a schematic perspective view of a component module 10, FIG. 1B is a schematic sectional view of the component module 10 taken on line A1-A1' illustrated in FIG. 1A, and FIG. 1C is a schematic sectional view of the component module 10 taken on line A2-A2' illustrated in FIG. 1A. Further, FIG. 2A is a schematic top view of the component module 10 observed from a direction B illustrated in FIG. 1A, and FIG. 2B is a schematic side view of the component module 10 observed from a direction C illustrated in FIG. 1A. FIG. 2A and FIG. 2B are schematic views for easy understanding of the positions of electronic components 13, which will be discussed hereinafter, so that the details of each member are omitted, as appropriate.

(1) Configuration of Each Element (1-1) Component Module 10

The component module 10 has a folded circuit board 11, a wiring pattern 12 formed on a predetermined surface of the circuit board 11, electronic components 13 surrounded by the folded circuit board 11, and a sealing resin 14 that seals the electronic components 13.

(1-2) Circuit Board 11

The circuit board 11 has a first base 11a, which is substantially rectangular, a second base 11b disposed substantially in parallel to the first base 11a, and a side section 11c connected to the first base 11a and the second base 11b. The first base 11a, the second base 11b, and the side section 11c collectively define a flexible substrate that is integrally formed using an insulating resin.

A surface of the first base 11a that faces the second base 11b is referred to as a first facing surface 11aU. A surface of the second base 11b that faces the first base 11a is referred to as a second facing surface 11bL. A surface of the side section 11c that faces the direction in which the first base 11a and the second base 11b extend (e.g., the leftward direction in FIG. 1B) is referred to as a side section facing surface 11cM.

(1-3) Wiring Pattern 12

A metallic wiring pattern 12aU is formed on the first facing surface 11aU, a metallic wiring pattern 12bL is formed on the second facing surface 11bL, and a metallic wiring pattern 12cM is formed on the side section facing surface 11cM. The wiring pattern 12aU, the wiring pattern 12bL, and the wiring pattern 12cM are electrically interconnected to integrally form the wiring pattern 12.

(1-4) Electronic Components 13

The electronic components 13 include first electronic components 13cM, second electronic components 13aU, and third electronic components 13bL, which will be described below. Referring to FIG. 2A and FIG. 2B, the first electronic components 13cM are denoted by the hatched rectangles, the second electronic components 13aU are denoted by the dotted-line rectangles, and the third electronic components 13bL are denoted by the solid-line rectangles.

(1-4-1) The First Electronic Components 13cM

The first electronic components 13cM are, for example, chip components (e.g., chip inductors, chip capacitors, chip resistors, or the like). Both ends of each of the first electronic components 13cM are provided with electrical terminals 13C. Each of the first electronic components 13cM has at least one contact surface 13T that extends between the two terminals 13C.

Each of the first electronic components 13cM is in contact with the first facing surface 11aU and the second facing surface 11bL. The phrase "in contact" as used herein when describing an electronic component and a facing surface means that a part of the electronic component is in contact, directly or through an adhesive member, with the facing surface, or that the terminals provided on the electronic component are electrically connected with a wiring pattern provided on the facing surface. As illustrated in FIG. 1B, one of the terminals 13C of the first electronic component 13cM is electrically connected to the wiring pattern 12aU provided on the first facing surface 11aU, and the other of the terminals 13C is electrically connected with the wiring pattern 12bL provided on the second facing surface 11bL. Further, the contact surface 13T of the first electronic component 13cM is in contact with the side section facing surface 11cM.

As described above, the first electronic component 13cM is in contact with the first base 11a, the second base 11b, and the side section 11c. According to the foregoing configuration, therefore, the first electronic component 13cM provides a support for maintaining the interval between the first base 11a and the second base 11b. This leads to an enhanced strength of the component module.

(1-4-2) Second Electronic Component 13aU and Third Electronic Component 13bL

The second electronic components 13aU and the third electronic components 13bL may be any electronic components such as, for example, chip components (e.g., chip inductors, chip capacitors, chip resistors or the like) or semiconductor devices (e.g., bare chips).

At least one second electronic component 13aU is mounted on the first facing surface 11aU such that the second electronic component 13aU is electrically connected to the wiring pattern 12aU. At least one third electronic component 13bL is mounted on the second facing surface 11bL such that the third electronic component 13bL is electrically connected to the wiring pattern 12bL.

(1-5) Sealing Resin 14

The sealing resin 14 is formed in a region surrounded by the first facing surface 11aU, the second facing surface 11bL, and the side section facing surface 11cM such that the sealing resin 14 seals the electronic components 13.

(2) Manufacturing Method

Referring to FIG. 3A to FIG. 3C and FIG. 4A and FIG. 4B, a manufacturing method of the component module 10 will be described.

Figure 3A:
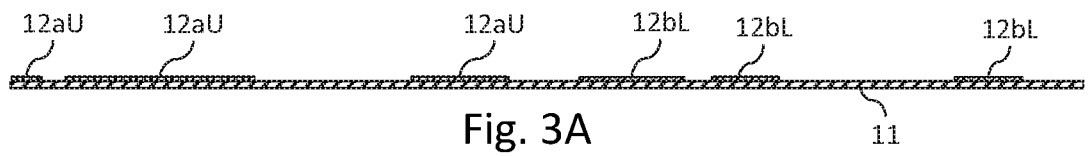
FIG. 3A is a diagram illustrating the manufacturing method of the component module 10.

First, as illustrated in FIG. 3A, the wiring pattern 12 (including the wiring pattern 12aU, the wiring pattern 12bL, and the wiring pattern 12cM) is formed using a copper foil on a surface of the sheet-like circuit board 11 obtained by hardening an insulating resin. It is to be noted that the wiring pattern 12cM does not appear in the sectional view of FIG. 3A.

Figure 3B:
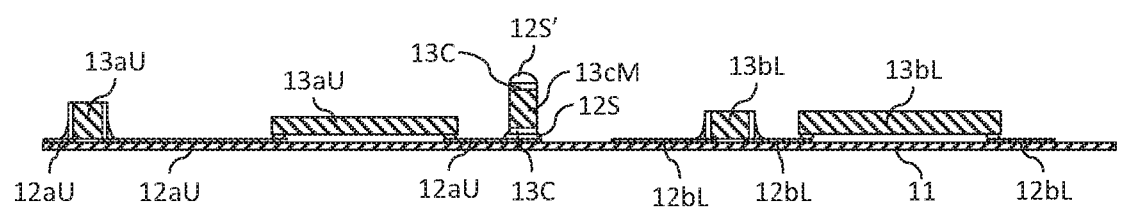
FIG. 3B is another diagram illustrating the manufacturing method of the component module 10.

Then, the electronic components 13 (including the first electronic component 13cM, the second electronic component 13aU, and the third electronic component 13bL) are mounted on the circuit board 11 such that the electronic components 13 are electrically connected to the wiring pattern 12, as illustrated in FIG. 3B. For example, the terminals of the second electronic component 13aU are connected to the wiring pattern 12aU by solder 12S, and the terminals of the third electronic component 13bL are connected to the wiring pattern 12bL by the solder 12S.

At this time, only one of the terminals 13C of the first electronic component 13cM is connected to the wiring pattern 12bL by the solder 12S. Meanwhile, a solder material 12S' (before soldering) is placed on the other of the terminals 13C of the first electronic component 13cM.

Figure 3C:
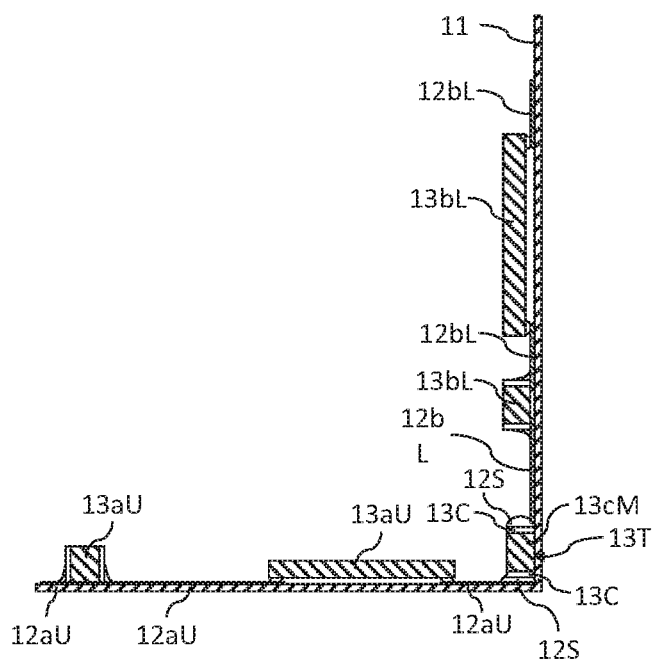
FIG. 3C is yet another diagram illustrating the manufacturing method of the component module 10.

Subsequently, as illustrated in FIG. 3C, the sheet-like circuit board 11 with the wiring pattern 12 and the electronic components 13 mounted thereon is bent substantially at a right angle at the boundary between the first facing surface 11aU and the side section facing surface 11cM such that the contact surface 13T of the first electronic component 13cM comes in contact with the side section facing surface 11cM.

Figure 4A:
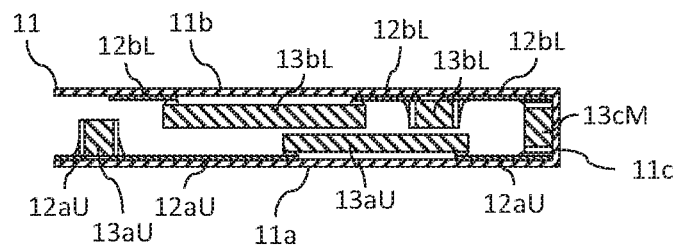
FIG. 4A is still another diagram illustrating the manufacturing method of the component module 10.

Subsequently, as illustrated in FIG. 4A, the circuit board 11, which has been bent substantially at a right angle at the boundary between the first facing surface 11aU and the side section facing surface 11cM, is bent substantially at a right angle at the boundary of the second facing surface 11bL and the side section facing surface 11cM. Further, the vicinity of the other of the terminals 13C of the first electronic component 13cM is heated by local heating to melt the solder material 12S' placed on the other terminal, thereby connecting the terminal 13C to the wiring pattern 12bL.

Figure 4B:
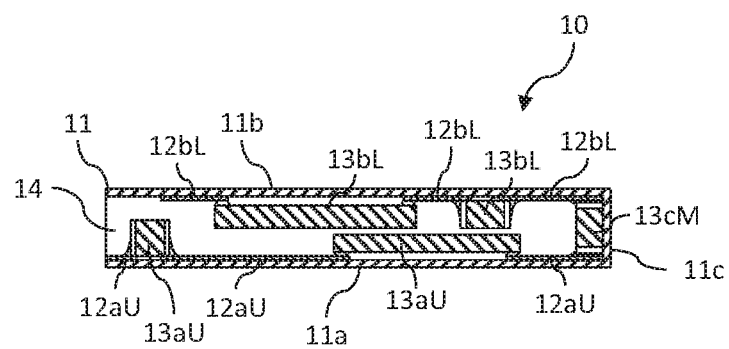
FIG. 4B is another diagram illustrating the manufacturing method of the component module 10.

Subsequently, as illustrated in FIG. 4B, the sealing resin 14 is formed in the space surrounded by the first base 11a, the second base 11b, and the side section 11c of the circuit board 11, which has been folded into a substantially U shape in the sectional view as described above. Thus, the component module 10 is obtained.

The method described above makes it possible to obtain the component module 10 in which the first electronic components 13cM are in contact with the first base 11a and the second base 11b through the terminals 13C and in contact with the side section 11c through the contact surfaces 13T. This enables the component module with an enhanced strength to be obtained.

Further, according to the aforesaid manufacturing method, the circuit board 11 with the electronic components 13 mounted thereon is folded before the sealing resin 14 is formed, thus making it possible to further reduce the interval between the second electronic component 13aU mounted on the first base 11a and the third electronic component 13bL mounted on the second base 11b. In other words, the second electronic component 13aU and the third electronic component 13bL can be overlapped position-wise in, for example, the direction of the thickness of the component module 10. This leads to a higher integration degree of the component module.

The following will describe other embodiments of the component module. In the following description, the aspects of the configurations of the embodiments that are different from the configuration of the first embodiment will be described, and a description of the same aspects as those of the first embodiment will be omitted, as appropriate.

Second Embodiment

Figure 5:
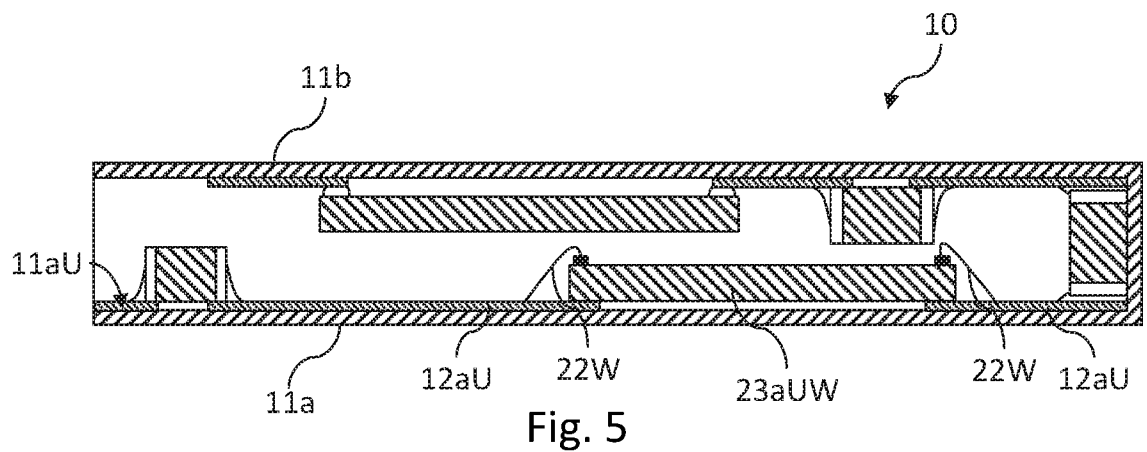
FIG. 5 is a schematic sectional view of the component module 10 according to a second embodiment of the present disclosure.

FIG. 5 is a schematic sectional view of the component module 10 as a second embodiment.

As illustrated in FIG. 5, the component module 10 has an electronic component 23aUW wire-mounted on the first facing surface 11aU. Two terminals are provided on an upper surface of the electronic component 23aUW. The two terminals are electrically connected to the wiring pattern 12aU by wires 22W. With this arrangement, a higher degree of design freedom of the component module is achieved.

The component module 10 may have another electronic component 23aUW wire-mounted on the second base 11b in the same manner, in addition to the electronic component 23aUW mounted on the first base 11a.

Third Embodiment

Figure 6:
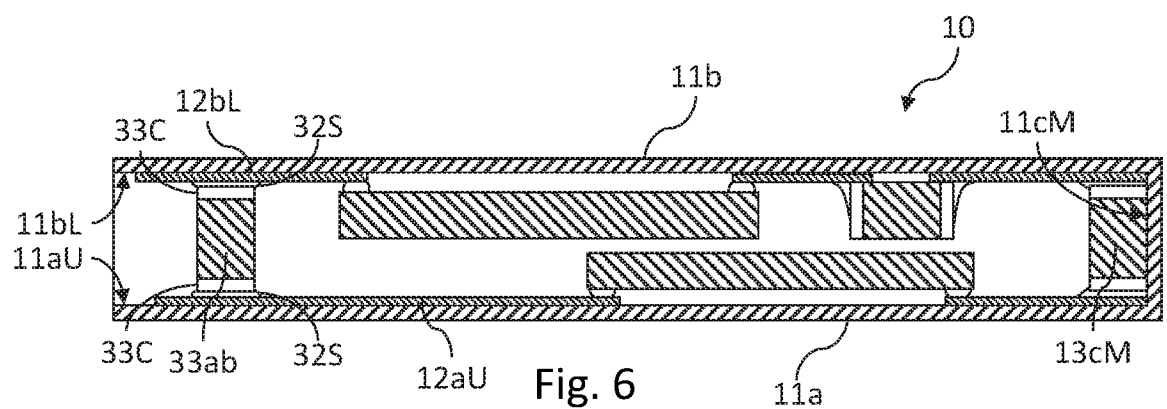
FIG. 6 is a schematic sectional view of the component module 10 according to a third embodiment of the present disclosure.

FIG. 6 is a schematic sectional view of the component module 10 as a third embodiment.

As illustrated in FIG. 6, the component module 10 further includes a fourth electronic component 33ab. The fourth electronic component 33ab is electrically connected to the first facing surface 11aU and the second facing surface 11bL, and terminals 33C of the fourth electronic component 33ab are electrically connected to the wiring pattern 12aU formed on the first facing surface 11aU and to the wiring pattern 12bL formed on the second facing surface 11bL. Further, the fourth electronic component 33ab is wired at a position where the fourth electronic component 33ab is not in contact with a facing surface at an end.

The configuration enables the fourth electronic component 33ab to be in contact with a first base 11a and a second base 11b through the terminals 33C. Hence, in addition to the first electronic component 13cM, the fourth electronic component 33ab also acts as a support for maintaining the interval between the first base 11a and the second base 11b, thus leading to a further enhanced strength of the component module.

Fourth Embodiment

Figure 7:
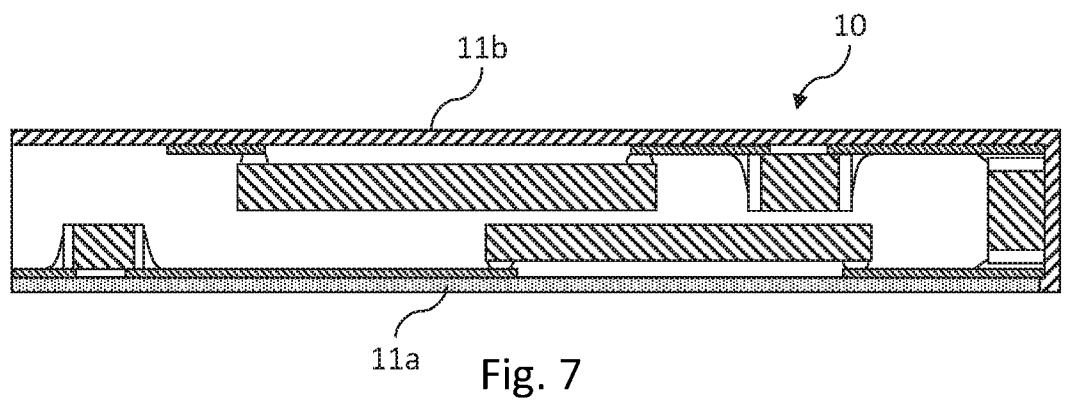
FIG. 7 is a schematic sectional view of the component module 10 according to a fourth embodiment of the present disclosure.

FIG. 7 is a schematic sectional view of the component module 10 as a fourth embodiment.

As illustrated in FIG. 7, the first base 11a comprises a rigid substrate. This arrangement enhances the strength of the component module.

The first base 11a may comprises a substrate that includes a flexible substrate joined to a rigid substrate. Further, the second base 11b may be composed of a rigid substrate or formed by joining a flexible substrate and a rigid substrate.

Fifth Embodiment

Figure 8:
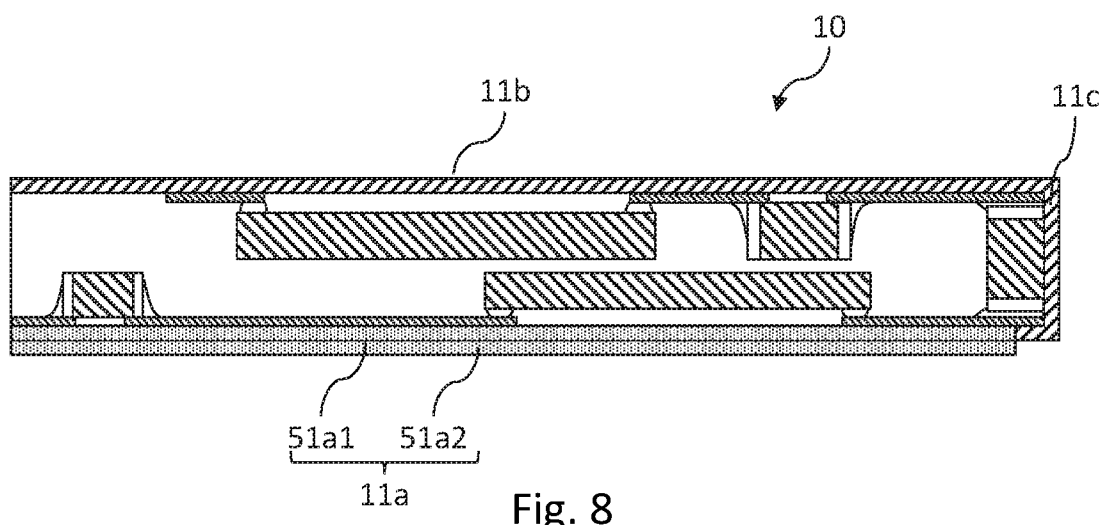
FIG. 8 is a schematic sectional view of the component module 10 according to a fifth embodiment of the present disclosure.

FIG. 8 is a schematic sectional view of the component module 10 as a fifth embodiment.

As illustrated in FIG. 8, the first base 11a comprises of a plurality of laminated rigid substrates 51a1 and 51a2. Provided in the rigid substrate 51a1 is a via hole (metal wiring) formed integrally with the wiring pattern 12. Further, a wiring pattern electrically connected with the foregoing via hole of the rigid substrate 51a1 is provided between the rigid substrate 51a1 and the rigid substrate 51a2. Further, a via hole electrically connected to the foregoing wiring pattern provided between the rigid substrate 51a1 and the rigid substrate 51a2 is provided in the rigid substrate 51a2. With this arrangement, a higher degree of design freedom of the component module is achieved.

As with the first base 11a, the second base 11b may be also configured to have a plurality of laminated rigid substrates provided with via holes therein.

Sixth Embodiment

Figure 9:
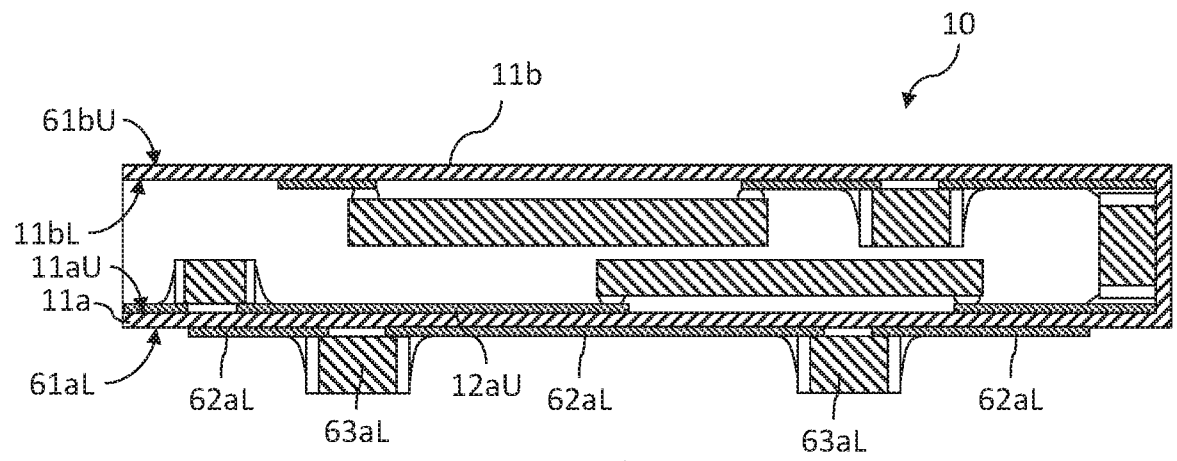
FIG. 9 is a schematic sectional view of the component module 10 according to a sixth embodiment of the present disclosure.
Figure 10A:
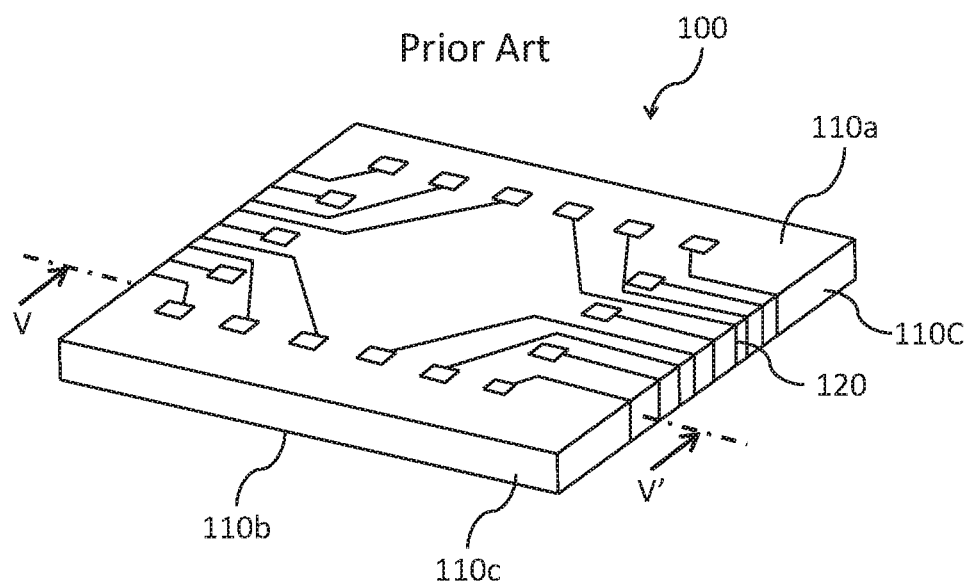
FIG. 10A is a schematic perspective view of a component built-in module 100 of a conventional example.
Figure 10B:
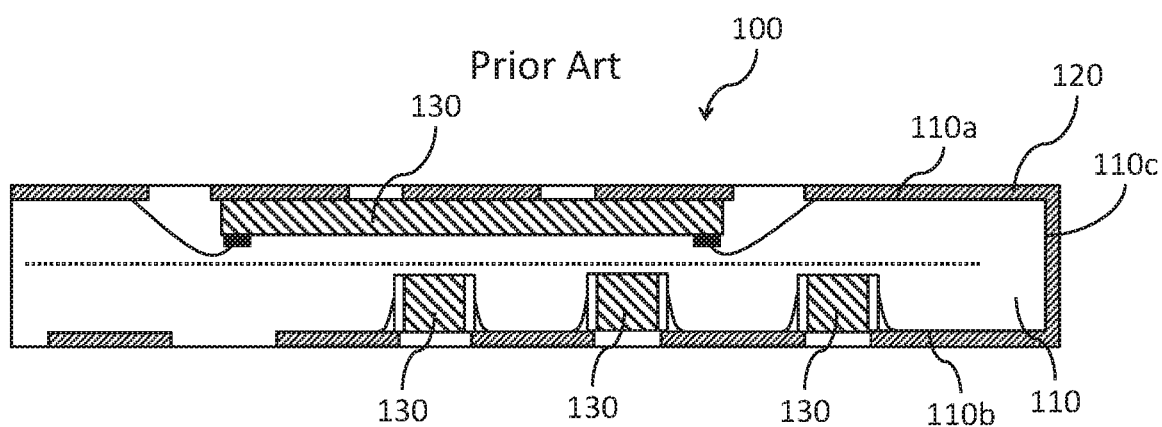
FIG. 10B is a schematic sectional view of the component built-in module 100 taken on line V-V' illustrated in FIG. 10A.

FIG. 9 is a schematic sectional view of the component module 10 as a sixth embodiment.

As illustrated in FIG. 9, in the component module 10, a first opposite surface 61aL is provided on the opposite side from the first facing surface 11aU of a first base 11a. A wiring pattern 62aL is formed on the first opposite surface 61aL. The first base 11a is provided with a via hole that electrically connects the wiring pattern 12aU formed on the first facing surface 11aU and the wiring pattern 62aL formed on the first opposite surface 61aL. Further, a fifth electronic component 63aL is mounted on the first opposite surface 61aL. With this arrangement, a higher degree of design freedom of the component module is achieved.

The component module 10 may further include a sealing resin that seals the fifth electronic component 63aL mounted on the first opposite surface 61aL. Further, in the same manner as that described above, a wiring pattern may be provided on a second opposite surface 61bU on the opposite side from the second facing surface 11bL of the second base 11b, and an electronic component may be mounted on the second opposite surface 61bU.

The above has described the illustrative embodiments of the present disclosure. As described in relation to the first embodiment, the first electronic component 13cM is in contact with the first facing surface 11aU of the first base 11a, the second facing surface 11bL of the second base 11b, and the side section facing surface 11cM of the side section 11c. Therefore, the first electronic component 13cM can support, from the inner side, the folded portion of the circuit board 11. This stabilizes the shape of the folded portion of the component module.

Further, as described in relation to the second embodiment, the component module 10 has the electronic component 23aUW wire-mounted on the first facing surface 11aU. This leads to a higher degree of design freedom of the component module.

Further, as described in relation to the third embodiment, the fourth electronic component 33ab is in contact with the first facing surface 11aU and the second facing surface 11bL, but not in contact with an end facing surface 11cM. This arrangement enables the fourth electronic component 33ab to support, from the inner side, the portion other than the folded portion of the circuit board 11, thus leading to an enhanced strength of the component module.

Further, as described in relation to the fourth embodiment, the first base 11a is formed of a rigid substrate. This leads to an enhanced strength of the component module.

Further, as described in relation to the fifth embodiment, the first base 11a comprises a plurality of laminated rigid substrates 51a1 and 51a2. The via hole formed integrally with the wiring pattern 12 is provided in the rigid substrate 51a1. In addition, the wiring pattern electrically connected to the foregoing via hole of the rigid substrate 51a1 is provided between the rigid substrate 51a1 and the rigid substrate 51a2. Further, the via hole electrically connected to the foregoing wiring pattern provided between the rigid substrate 51a1 and the rigid substrate 51a2 is provided in the rigid substrate 51a2. Thus, a higher degree of design freedom of the component module is achieved.

Further, as described in relation to the sixth embodiment, the wiring pattern 62aL is formed on the first opposite surface 61aL provided on the opposite side from the first facing surface 11aU of the first base 11a. The first base 11a is provided with a via hole that electrically connects the wiring pattern 62aU formed on the first facing surface 11aU and the wiring pattern 62aL formed on the first opposite surface 61aL. Further, the fifth electronic component 63aL is mounted on the first opposite surface 61aL. With this arrangement, a higher degree of design freedom of the component module is achieved.

The embodiments described above are intended for easy understanding of the present invention, and are not to be interpreted as limiting the present disclosure. The elements used in the embodiments and the placement, the materials, the conditions, the shapes, the sizes, and the like of the elements are not limited to those illustrated and may be changed, as appropriate. Further, the configurations illustrated in different embodiments can be partly replaced or combined.

What is claimed is:

1. A component module comprising:
    a circuit board having a first base, a second base facing the first base, and a side section connected to the first base and the second base;
    a wiring pattern provided on at least one of a first facing surface of the first base that faces the second base, a second facing surface of the second base that faces the first base, and a side section facing surface of the side section that faces a direction in which the first base and the second base extend;
    an electronic component that is in contact with the first facing surface, the second facing surface, and the side section facing surface; and
    a sealing section provided in a region surrounded by the first facing surface, the second facing surface, and the side section facing surface such that the sealing section seals the electronic component,
    wherein the electronic component acts as a support for maintaining an interval between the first base and the second base.

2. The component module according to claim 1, further comprising another electronic component mounted on the first facing surface.

3. The component module according to claim 2, wherein the another electronic component is wire-mounted on the first facing surface.

4. The component module according to claim 2, wherein the another electronic component is in contact with the first facing surface and the second facing surface but is not in contact with the side section facing surface.

5. The component module according to claim 2, wherein the another electronic component acts as a support for maintaining an interval between the first base and the second base.

6. The component module according to claim 1, wherein the first base, the second base, and the side section collectively define a flexible substrate that is integrally formed.

7. The component module according to claim 1, wherein the first base comprises a rigid substrate.

8. The component module according to claim 7, wherein the first base comprises a flexible substrate joined to the rigid substrate.

9. The component module according to claim 7, wherein the side section comprises a flexible substrate.

10. The component module according to claim 1, wherein the first base comprises a plurality of laminated circuit boards.

11. The component module according to claim 1, wherein the first base comprises a first opposite surface on the opposite side from the first facing surface, and a first through hole that connects the first facing surface and the first opposite surface.

12. The component module according to claim 11, further comprising an additional electronic component mounted on the first opposite surface of the first base.

13. The component module according to claim 12, wherein the wiring pattern is provided at least on the first facing surface, on the first opposite surface, and in the first through hole.

14. The component module according to claim 12, further comprising another sealing section that seals the additional electronic component mounted on the first opposite surface.

15. The component module according to claim 1, wherein the electronic component directly contacts at least one of the first facing surface, the second facing surface, and the side section facing surface.

16. The component module according to claim 1, wherein the electronic component directly contacts the side section facing surface.

17. The component module according to claim 1, wherein:
the electronic component contacts a first wiring pattern on the first facing surface and a second wiring pattern on the second facing surface, and
the electronic component contacts, either directly or through an adhesive member, the side section facing surface.

18. A component module comprising:
a circuit board having a first base, a second base facing the first base, and a side section connected to the first base and the second base;
a wiring pattern provided on at least one of a first facing surface of the first base that faces the second base, a second facing surface of the second base that faces the first base, and a side section facing surface of the side section that faces a direction in which the first base and the second base extend;
an electronic component that is in contact with the first facing surface, the second facing surface, and the side section facing surface; and
a sealing section provided in a region surrounded by the first facing surface, the second facing surface, and the side section facing surface such that the sealing section seals the electronic component,
wherein the electronic component includes a first terminal electrically connected to a first wiring pattern on the first facing surface,
wherein the electronic component includes a second terminal electrically connected to a second wiring pattern on the second facing surface,
wherein the electronic component contacts, either directly or through an adhesive member, the side section facing surface, and
wherein the electronic component acts as a support for maintaining an interval between the first base and the second base.

19. The component module according to claim 18, wherein the electronic component directly contacts the side section facing surface.

* * * * *